(12) United States Patent
Jiang et al.

(10) Patent No.: US 12,376,482 B2
(45) Date of Patent: Jul. 29, 2025

(54) STRETCHABLE SUBSTRATE AND STRETCHABLE DISPLAY DEVICE

(71) Applicant: AUO Corporation, Hsin-Chu (TW)

(72) Inventors: Cheng-Wei Jiang, Hsin-Chu (TW); Yi-Da He, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 485 days.

(21) Appl. No.: 17/954,414

(22) Filed: Sep. 28, 2022

(65) Prior Publication Data

US 2023/0105157 A1     Apr. 6, 2023

(30) Foreign Application Priority Data

Oct. 6, 2021 (TW) .................................. 110137192

(51) Int. Cl.
    *H01L 51/00*     (2006.01)
    *H10K 59/131*     (2023.01)
    *H10K 77/10*     (2023.01)

(52) U.S. Cl.
    CPC ......... *H10K 77/111* (2023.02); *H10K 59/131* (2023.02)

(58) Field of Classification Search
None
See application file for complete search history.

(56) References Cited

U.S. PATENT DOCUMENTS

| | | |
|---|---|---|
| 2005/0264189 A1 | 12/2005 | Choi et al. |
| 2018/0358418 A1 | 12/2018 | Hong et al. |
| 2021/0066564 A1 | 3/2021 | Kanaya |
| 2021/0126172 A1* | 4/2021 | Eom ...................... H10D 86/60 |

FOREIGN PATENT DOCUMENTS

| | | |
|---|---|---|
| CN | 112951870 A | 6/2021 |
| TW | 202114471 A | 4/2021 |
| WO | 2021238726 A1 | 12/2021 |

OTHER PUBLICATIONS

Office Action issued by the State Intellectual Property Office of the People's Republic of China on Dec. 17, 2024, for Application No. 202210215660.6, China.
Office Action issued by (TIPO) Intellectual Property Office Ministry of Economic Affairs R.O.C. on Nov. 24, 2022 for Application No. 110137192, Tawian.

\* cited by examiner

*Primary Examiner* — William C Trapanese
(74) *Attorney, Agent, or Firm* — Tim Tingkang Xia, Esq.; Troutman Pepper Locke LLP

(57) ABSTRACT

A stretchable substrate metal structure includes a patterned insulating structure, conductive wires, display elements, and covering layers. The patterned insulating structure includes device portions and circuit portions. The surface of each device portion has at least one first groove. At least two of the device portion are separated by a recess. A width of each circuit portion is less than a width of each device portion. Adjacent device portions are connected via corresponding circuit portions. The conductive wires are located in the circuit portions. The display elements are located on the device portions. The at least one first groove of each device portion at least partially surrounds a corresponding display element. Each covering layer is located on a corresponding device portion and covers the corresponding display element.

7 Claims, 10 Drawing Sheets

STRETCHABLE SUBSTRATE AND STRETCHABLE DISPLAY DEVICE

CROSS-REFERENCE TO RELATED PATENT APPLICATION

This non-provisional application claims priority to and the benefit of, pursuant to 35 U.S.C. § 119 (a), patent application No. 110137192 filed in Taiwan on Oct. 6, 2021. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to a stretchable substrate and a stretchable display device.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the development of electronic technology, electronic products are constantly innovating. In order to allow the electronic products to be applied in various fields, characteristics such as being stretchable, thin and having unlimited appearances thereof are gradually emphasized. In other words, the electronic products are gradually required to have different appearances according to different applications and applied environments, and thus the electronic products must have stretchability. For example, a stretchable display device may be integrated on a spherical surface, thus obtaining a spherical display device.

SUMMARY

One aspect of the present disclosure provides a stretchable substrate, which may improve the issues caused by overflow of the covering layer on the display elements.

Another aspect of the present disclosure provides a stretchable display device, which may improve the issues caused by overflow of the covering layer on the display elements.

In at least one embodiment of the present disclosure, a stretchable substrate is provided, including a patterned insulating structure, a plurality of conductive wires, a plurality of display elements and a plurality of covering layers. The patterned insulating structure includes a plurality of device portions and a plurality of circuit portions. A surface of each of the device portions has at least one first groove. At least two of the device portions are separated by a recess. A width of each of the circuit portions is less than a width of each of the device portions. Adjacent ones of the device portions are connected via corresponding ones of the circuit portions. The conductive wires are located in the circuit portions. The display elements are correspondingly located on the device portions. The at least one first groove of each of the device portions surrounds a corresponding one of the display elements. Each of the covering layers is located on a corresponding one of the device portions and covers the corresponding one of the display elements.

In at least one embodiment of the present disclosure, a stretchable display device is provided, including a patterned insulating structure, a plurality of display elements, a plurality of conductive wires and a plurality of covering layers. The patterned insulating structure includes a plurality of device portions and a plurality of circuit portions. The device portions are arranged in an array along a first direction and a second direction. A width of each of the circuit portions is less than a width of each of the device portions. Adjacent ones of the device portions are connected via corresponding ones of the circuit portions. The display elements are correspondingly located on the device portions. A surface of each of the device portions has at least one first groove surrounding a corresponding one of the display elements. The conductive wires electrically connected to the display elements. Each of the covering layers is located on a corresponding one of the device portions and covers the corresponding one of the display elements.

These and other aspects of the present disclosure will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

The detailed features and advantages of the present invention are described below in great detail through the following embodiments, and the content of the detailed description is sufficient for persons skilled in the art to understand the technical content of the present invention and to implement the present invention there accordingly. Based upon the content of the specification, the claims, and the drawings, persons skilled in the art can easily understand the relevant objectives and advantages of the present invention. The following embodiments further describe the viewpoints of the present invention, but are not intended to limit the scope of the present invention in any way.

Figure 1A:
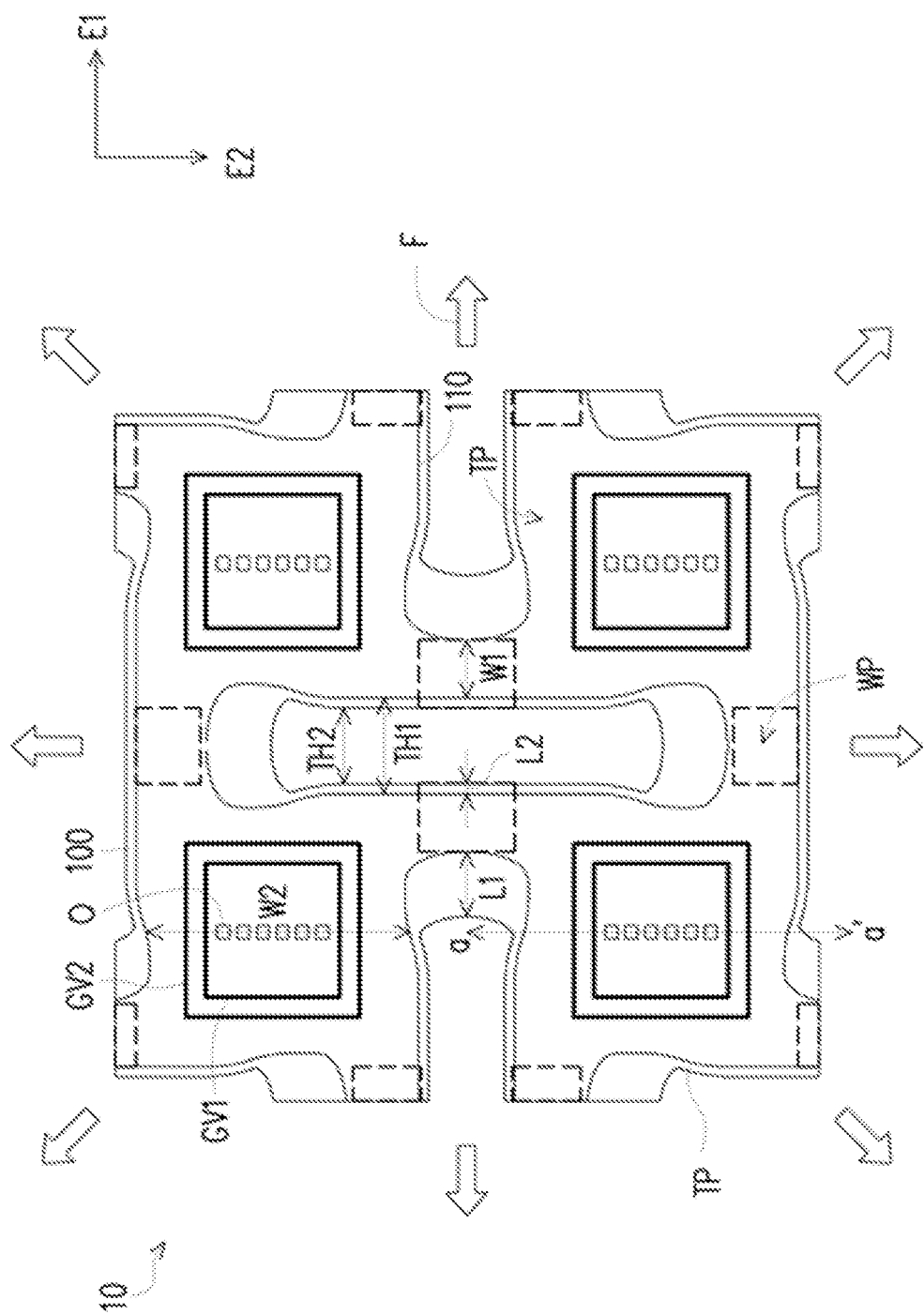
FIG. 1A is a partial top schematic view of a stretchable substrate according to one embodiment of the present disclosure.

FIG. 1A is a partial top schematic view of a stretchable substrate according to one embodiment of the present disclosure. Specifically, FIG. 1A illustrates a patterned substrate and a patterned insulating structure, and other components therein are omitted.

Referring to FIG. 1A, the stretchable substrate 10 (also referred to as a stretchable display device) includes a patterned substrate 100, a patterned insulating structure 110, a plurality of display elements (not shown in FIG. 1A), a plurality of conductive wires (not shown in FIG. 1A) and a plurality of covering layers (not shown in FIG. 1A). In FIG. 1A, the stretchable substrate 10 is stretched outward along a direction of the arrow F. In other words, FIG. 1A is a schematic view of the stretchable substrate after being stretched.

The patterned substrate 100 has elasticity and ductility. In other words, the patterned substrate 100 is stretchable. For example, in the present embodiment, materials of the patterned substrate 100 may include polyimide (PI), polyethylene naphthalate (PEN), polyethylene terephthalate (PET), polycarbonates (PC), polyether sulfone (PES), polyarylate, other suitable materials, or a combination of at least two of the aforementioned materials, but the present disclosure is not limited thereto.

The patterned substrate 100 has a plurality of through holes TH2. In the present embodiment, each through hole TH2 is dumbbell-shaped. In the present embodiment, some of the through holes TH2 extend along a first direction E1, and some other through holes TH2 extend along a second direction E2. The through holes TH2 extending along the first direction E1 and the through holes TH2 extending along the second direction E2 are arranged alternately, thus enhancing the scalability of the stretchable substrate.

The patterned insulating structure 110 is located on the patterned substrate 100. The patterned insulating structure 110 may be, for example, a single-layered or multi-layered structure.

The patterned insulating structure 110 includes a plurality of device portions TP and a plurality of circuit portions WP. A width W1 of each circuit portion WP is less than a width W2 of each device portion TP. The device portions TP are arranged in an array along the first direction E1 and the second direction E2. Adjacent device portions TP are connected through corresponding circuit portions WP. In other words, two ends of each of at least some circuit portions WP are respectively connected to two corresponding device portions TP. At least two of the device portions TP are separated by a recess TH1. In the present embodiment, the recess TH1 is an opening of the patterned insulating structure 110, and each recess TH1 is surrounded by four device portions TP and four circuit portions WP. In the present embodiment, the recesses TH1 of the patterned insulating structure 110 overlap with the through holes TH2 of the patterned substrate 100. In the present embodiment, each recess TH1 is dumbbell-shaped. Some of the recesses TH1 extend along the first direction E1, and some other recesses TH1 extend along the second direction E2. The recesses TH1 extending along the first direction E1 and the recesses TH1 extending along the second direction E2 are arranged alternately, thus enhancing the scalability of the stretchable substrate.

A surface of each device portion TP has at least one first groove GV1. In the present embodiment, the surface of each device portion TP has a plurality of openings O, the first groove GV1 at least partially surrounding the openings O, and a second groove GV2 at least partially surrounding the first groove GV1.

Figure 1B:
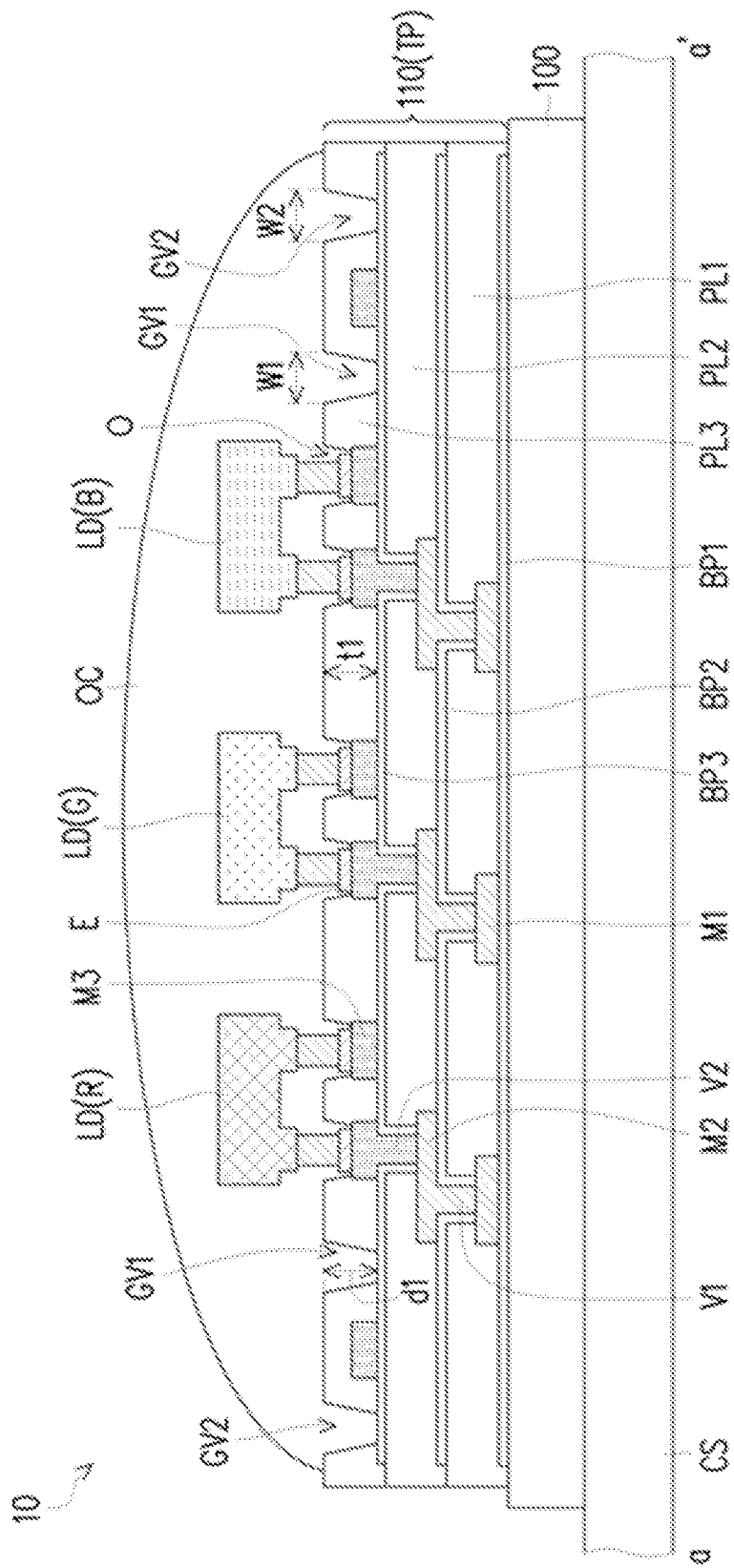
FIG. 1B is a sectional schematic view of a stretchable substrate according to one embodiment of the present disclosure.

FIG. 1B is a sectional schematic view of a stretchable substrate according to one embodiment of the present disclosure, where FIG. 1B corresponds to the location of the line a-a' in FIG. 1A.

Referring to FIGS. 1A and 1B, the stretchable substrate 10 is located on a support plate CS. The support plate CS may be, for example, a glass support plate, a semiconductor support plate, a metal support plate or other suitable support plate.

The patterned insulating structure 110 of the stretchable substrate 10 is located on the patterned substrate 100, and includes a first insulating layer PL1, a second insulating layer PL2 and a third insulating layer PL3.

The first insulating layer PL1 is located above the patterned substrate 100. In certain embodiments, a first buffer layer BP1 exists selectively between the first insulating layer PL1 and the patterned substrate 100.

The second insulating layer PL2 is located above the first insulating layer PL1. In certain embodiments, a second buffer layer BP2 exists selectively between the second insulating layer PL2 and the first insulating layer PL1.

The third insulating layer PL3 is located above the second insulating layer PL2. In certain embodiments, a third buffer layer BP3 exists selectively between the third insulating layer PL3 and the second insulating layer PL2. In the present embodiment, the third insulating layer PL3 has a plurality of openings O, a plurality of first grooves GV1 and a plurality of second grooves GV2. The openings O, the first grooves GV1 and the second grooves GV2 are located on the surface of the device portions TP. In certain embodiments, a thickness t1 of the third insulating layer PL3 is 0.5 μm to 10 μm, and a depth d1 of the openings O, the first grooves GV1 and the second grooves GV2 is 0.5 μm to 10 μm. In certain embodiments, a width w1 of the first grooves GV1 and a width w2 of the second grooves GV2 are 0.5 μm to 10 μm.

In certain embodiments, the patterned insulating structure 110 include organic and inorganic insulating materials, and the method of forming the patterned insulating structure 110 includes the photolithography process and the etching process. For example, the first insulating layer PL1, the second insulating layer PL2 and the third insulating layer PL3 all include cured photoresist materials, and the first buffer layer BP1, the second buffer layer BP2 and the third buffer layer BP3 include cured photoresist materials or patterned inorganic materials by etching. In the present embodiment, the third insulating layer PL3 is formed after forming the third buffer layer BP3 and the second insulating layer PL2. Thus, the openings O, the first grooves GV1 and the second grooves GV2 in the third insulating layer PL3 do not extend into the third buffer layer BP3 and the second insulating layer PL2. Specifically, when processing the photolithography process to form the third insulating layer PL3 including the openings O, the first grooves GV1 and the second grooves GV2, the other photoresist layers below the third insulating layer PL3 have been cured. Thus, the developer used in the photolithography process does not remove the other photoresist layers below the third insulating layer PL3, such that the openings O, the first grooves GV1 and the second grooves GV2 do not extend into the other photoresist layers below the third insulating layer PL3.

In the present embodiment, the first insulating layer PL1, the first buffer layer BP1, the second insulating layer PL2, the second buffer layer BP2, the third insulating layer PL3 and the third buffer layer BP3 of the patterned insulating structure 110 are located in the device portions TP, and the first insulating layer PL1, the first buffer layer BP1, the second insulating layer PL2, the second buffer layer BP2, the third insulating layer PL3 and the third buffer layer BP3 extend selectively into the circuit portions WP. In certain embodiments, a thickness of the circuit portions WP is less than a thickness of the device portions TP, thus enhancing the scalability of the stretchable substrate. For example, the device portions TP include more layers of insulating layers and/or more layers of buffer layers than the circuit portions WP, but the present disclosure is not limited thereto.

In certain embodiments, the circuit portions WP are deviatively provided on the patterned substrate 100. Specifically, a distance L1 between one side surface of a circuit portion WP and a corresponding through hole TH2 of the patterned substrate 100 is greater than a distance L2 between another side surface of the circuit portion WP and another corresponding through hole TH2 of the patterned substrate 100. By providing the circuit portions WP deviatively above the patterned substrate 100, the issue of stress concentration causing the conductive wires in the circuit portions WP to break may be prevented. However, although in the present embodiment, the circuit portions WP are deviatively provided above the patterned substrate 100, the present disclosure is not limited thereto. In other embodiments, the distance L1 is selectively equal to the distance L2.

A first conductive layer M1, a second conductive layer M2 and a third conductive layer M3 are located in the patterned insulating structure 110. In the present embodiment, the first conductive layer M1 is located above the patterned substrate 100 and is selectively located above the first buffer layer BP1. The second conductive layer M2 is located above the first insulating layer PL1 and is selectively located above the second buffer layer BP2, and the second conductive layer M2 is selectively electrically connected to the first conductive layer M1. For example, some of the second conductive layer M2 is electrically connected to the first conductive layer M1 through a conductive via V1 in the first insulating layer PL1, and the second conductive layer M2 and the conductive via V1 are for example formed altogether. The third conductive layer M3 is located above the second insulating layer PL2 and is selectively located above the third buffer layer BP3, and the third conductive layer M3 is selectively electrically connected to the second conductive layer M2. For example, some of the third conductive layer M3 is electrically connected to the second conductive layer M2 through a conductive via V2 in the second insulating layer PL2, and the third conductive layer M3 and the conductive via V2 are for example formed altogether.

In the present embodiment, at least one of the first conductive layer M1, the second conductive layer M2 and the third conductive layer M3 include the conductive wires located in the circuit portions WP, and the conductive wires extend into the device portions TP from the circuit portions WP.

In certain embodiments, the materials of the first conductive layer M1, the second conductive layer M2 and the third conductive layer M3 include metals of Cr, Au, Ag, Cu, Sn, Pb, Hf, W, Mo, Nd, Ti, Ta, Al, Zn, etc., alloys thereof, metal oxides thereof, metal nitrides thereof, combination thereof, or other conductive materials. In certain embodiments, each of the first conductive layer M1, the second conductive layer M2 and the third conductive layer M3 includes a single-layered or multi-layered structure. For example, each of the first conductive layer M1, the second conductive layer M2 and the third conductive layer M3 may include a Ti/Al/Ti stack structure, a Mo/Al/Mo stack structure or other suitable stack structures of conductive materials.

In the present embodiment, the openings O of the third insulating layer PL3 overlap with the third conductive layer M3. In other words, the openings O partially expose the third conductive layer M3. In the present embodiment, the first grooves GV1 and the second grooves GV2 do not overlap with the third conductive layer M3. In other words, the third conductive layer M3 is not exposed by the first grooves GV1 and the second grooves GV2, but the present disclosure is not limited thereto. In other embodiments, a top surface of the third conductive layer M3 is partially exposed by the first grooves GV1 and the second grooves GV2, but a side surface of the third conductive layer M3 is not exposed by the first grooves GV1 and the second grooves GV2. It should be noted that, in FIGS. 1A and 1B, the locations of the openings O are merely shown for illustration. The openings O may be located at any locations within the region being surrounded by the first grooves GV1, and the actual location of the openings O may be adjusted based on the requirements.

A plurality of electrodes E are formed in the openings O, and cover the third conductive layer M3 at the bottom of the openings O. In certain embodiments, the electrodes E include metal oxides, such as indium tin oxide (ITO), but the present disclosure is not limited thereto. The electrodes E may include other conductive materials suited for protecting the third conductive layer M3 partially exposed at the openings O.

In the present embodiment, since the third conductive layer M3 is not exposed by the first grooves GV1 and/or the second grooves GV2, the etchant used in forming the electrodes E does not etch the third conductive layer M3, thus preventing the third conductive layer M3 from being etched and affecting the conductive characteristics thereof. In certain embodiments, the third conductive layer M3 includes a multi-layered structure, such as a stack structure of a titanium layer, an aluminum layer and a titanium layer, in which the aluminum layer located between the two titanium layers may be easily etched by the etchant (such as oxalic acid) used in forming the electrodes E, and the titanium layer located at the top surface of the third conductive layer M3 is not easily etched by the etchant used in forming the electrodes E. Thus, even if the titanium layer located at the top surface of the third conductive layer M3 is exposed by the first grooves GV1 and/or the second grooves GV2, the etchant used in forming the electrodes E does not easily etch the third conductive layer M3. In other words, as long as the side surface of the third conductive layer M3, which may expose the aluminum layer, is covered, the third conductive layer M3 may be prevented from being etched by the etchant used in forming the electrodes E.

The display elements LD are located on the device portions TP, and are electrically connected to the electrodes E. In certain embodiments, the display elements LD are disposed on the device portions TP by the mass transfer process. The display elements LD are electrically connected to the third conductive layer M3 through the electrodes E, and are further electrically connected to the conductive wires of the third conductive layer M3, the second conductive layer M2 and/or the first conductive layer M1 located in the circuit portions WP. In certain embodiments, the display elements LD include organic light emitting diodes (OLEDs), micro light emitting diodes (μLEDs) or other light emitting elements. The display elements LD may be electrically connected to the electrodes E through, for example, eutectic bonding, conductive adhesive bonding, soldering or other similar methods. In the present embodiment, each device portion TP is provided with different colors of the display elements LD thereon, thus forming a color pixel. For example, each device portion TP is provided with a red display element R, a green display element G and a blue display element B thereon.

The first grooves GV1 at least partially surround the corresponding display elements LD. In the present embodiment, each first groove GV1 at least partially surrounds three display elements LD. The second grooves GV2 at least partially surround the first grooves GV1.

The covering layers OC are located on the device portions TP, and each covering layer OC is located on a corresponding device portion TP. The covering layers OC covers the corresponding display elements LD. The covering layers OC are, for example, transparent optical adhesive (or transparent encapsulation adhesive), and are suited for protecting the display elements LD. In certain embodiments, the forming method of the covering layers OC include ink-jet printing or other suitable methods. In the present embodiment, the first grooves GV1 and the second grooves GV2 may function as the overflow grooves of the covering layers OC, which is conducive to limiting the covering layers OC on the device portions TP, and preventing the covering layers OC from overflowing to other locations. In the present embodiment, each covering layer OC is filled in the corresponding first groove GV1, and each covering layer OC is selectively filled in the corresponding second groove GV2.

In certain embodiments, after forming the patterned insulating structure 110, the first conductive layer M1, the second conductive layer M2, third conductive layer M3 and the electrodes E on the unpatterned substrate, the substrate is patterned (for example, by etching) to form the patterned substrate 100. Then, the display elements LD are bonded to the electrodes E, and the covering layers OC are formed on the display elements LD. Finally, the patterned substrate 100 and other components located thereon are lifted from the support plate CS. The patterned substrate 100 and other components located thereon may be lifted from the support plate CS by, for example, laser lift off or other suitable methods.

In the present embodiment, by providing the first grooves GV1 and the second grooves GV2, the covering layers OC do not easily overflow outside the device portions TP, thus preventing the covering layers OC from flowing into the recesses TH1 and the through holes TH2 and contacting the support plate CS. Thus, the covering layers OC may be prevented from being adhered to the support plate CS, and manufacturing yield of lifting the patterned substrate 100 from the support plate CS may be enhanced.

Figure 2:
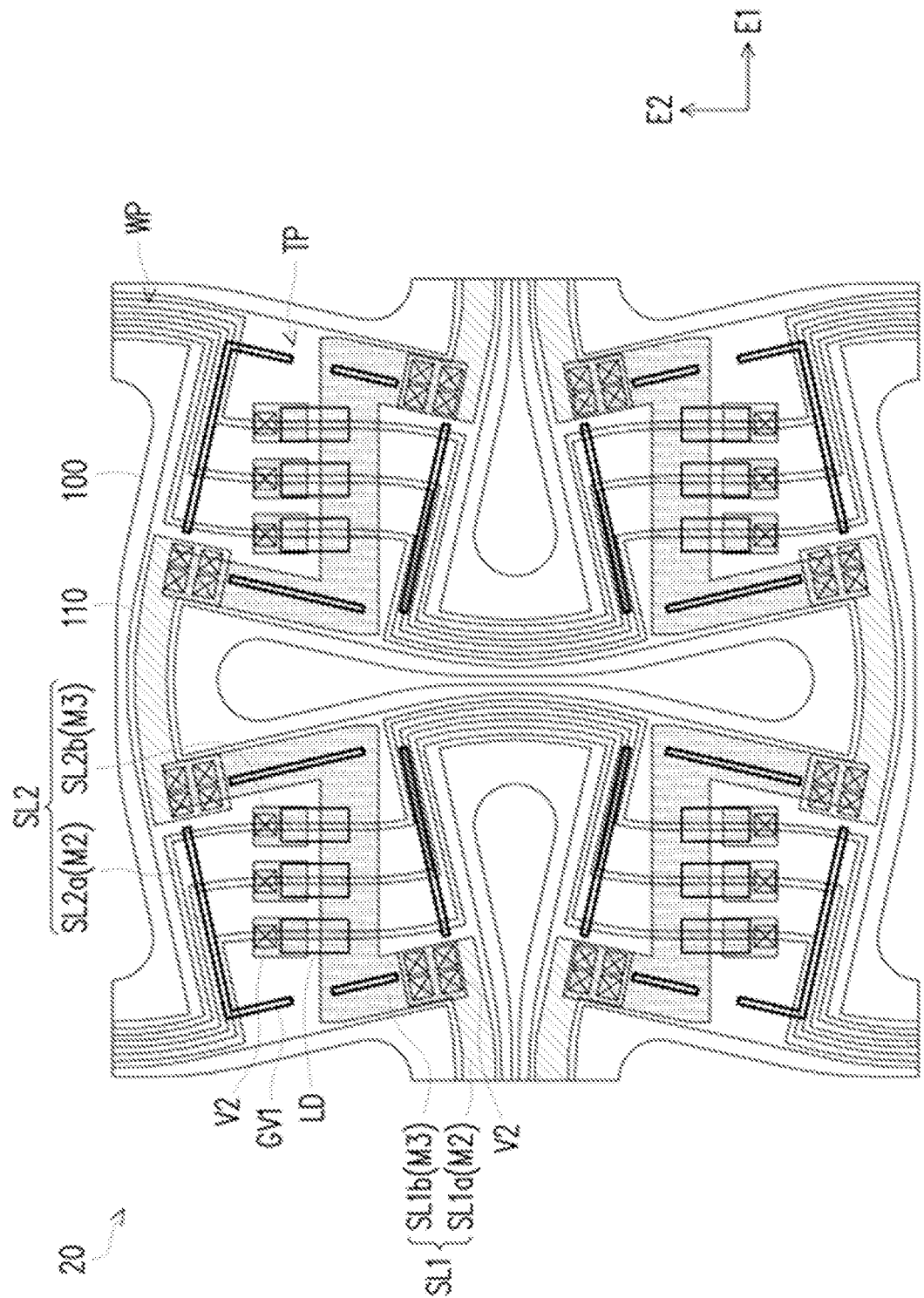
FIG. 2 is a partial top schematic view of a stretchable substrate according to one embodiment of the present disclosure.

FIG. 2 is a partial top schematic view of a stretchable substrate according to one embodiment of the present disclosure. Specifically, FIG. 2 illustrates a patterned substrate 100, the patterned insulating structure 110, the second conductive layer M2, the third conductive layer M3 and the display elements LD, and other components therein are omitted. It should be noted that the embodiment of FIG. 2 takes the reference numbers and certain contents of the embodiments of FIGS. 1A and 1B, in which the identical or similar reference numbers are used to refer to identical or similar elements, and descriptions of identical technology are hereinafter omitted. The descriptions of the omitted parts may be referenced in the aforementioned embodiment, and are thus not further elaborated herein.

Referring to FIG. 2, FIG. 2 is a schematic view of the stretchable substrate before being stretched. The stretchable substrate 20 (also referred to as a stretchable display device) includes a patterned substrate 100, a patterned insulating structure 110, a plurality of display elements LD, a plurality of conductive wires and a plurality of covering layers (not shown in FIG. 2). In the present embodiment, the second conductive layer M2 and the third conductive layer M3 include the conductive wires. In the present embodiment, the conductive wires include a plurality of first conductive wires SL1 and a plurality of second conductive wires SL2.

The first conductive wires SL1 extend along the first direction E1, and are electrically connected to the display elements LD on the device portions TP arranged in the first direction E1. For example, in the present embodiment, the first conductive wires SL1 include the transmitting portions SL1a that belong to the second conductive layer M2 and the connecting portions SL1b that belong to the third conductive layer M3. The transmitting portions SL1a are located in the circuit portions WP of the patterned insulating structure 110, and extend into the device portions TP of the patterned insulating structure 110. The connecting portions SL1b are located in the device portions TP of the patterned insulating structure 110, and are electrically connected to the transmitting portions SL1a through the conductive vias V2.

In certain embodiments, the at least three corresponding display elements LD on each device portion TP are electrically connected to a same corresponding first conductive wire SL1. For example, the third insulating layer has three openings (not shown in FIG. 2) overlapping with the connecting portions SL1b, and three electrodes (not shown in FIG. 2) are respectively formed in the three openings. The three display elements LD are electrically connected to the connecting portions SL1b through the three electrodes. The first conductive wires SL1 may be suited for transmitting, for example, ground voltage signals or common voltage signals.

The second conductive wires SL2 extend along the second direction E2, and are electrically connected to the display elements LD on the device portions TP arranged in the second direction E2. For example, in the present embodiment, the second conductive wires SL2 include the transmitting portions SL2a that belong to the second conductive layer M2 and the connecting portions SL2b that belong to the third conductive layer M3. The transmitting portions SL2a are located in the circuit portions WP of the patterned insulating structure 110, and extend into the device portions TP of the patterned insulating structure 110. The connecting portions SL2b are located in the device portions TP of the patterned insulating structure 110, and are electrically connected to the transmitting portions SL2a through the conductive vias V2. In the present embodiment, a width of the first conductive wires SL1 is greater than a width of the second conductive wires SL2.

In certain embodiments, the at least three corresponding display elements LD on each device portion TP are electrically connected respectively to at least three corresponding second conductive wires SL2. For example, the third insulating layer has three openings (not shown in FIG. 2) overlapping with the connecting portions SL2b, and three electrodes (not shown in FIG. 2) are respectively formed in the three openings. The three display elements LD are electrically connected to the connecting portions SL2b through the three electrodes. The first grooves GV1 on the surface of each device portion TP partially surround the corresponding display elements LD.

In the present embodiment, to prevent the first grooves GV1 from exposing the side surface of the third conductive layer M3, a plurality of first grooves GV1 separated from each other are provided on the surface of each device portion TP. Some of the first grooves GV1 overlap with the third conductive layer M3, but do not extend to the side surface of the third conductive layer M3. For example, the first grooves GV are located in the third insulating layer, in which the third insulating layer (such as the third insulating layer PL3 of FIG. 1B) covers side surfaces of the first conductive wires SL1 of the conductive wires, and the first grooves GV partially expose the top surfaces of the first conductive wires SL1 of the conductive wires. Specifically, the third insulating layer covers the side surfaces of the connecting portions SL2b, and partially exposes the top surfaces of the connecting portions SL2b.

Based on the foregoing disclosure, by providing a plurality of first grooves GV1, the issue resulted by the overflow of the covering layers may be prevented.

It should be noted that the stretchable substrate 20 of FIG. 2 is a passive display device, and the patterned insulating structure 110 is not provided with an active element, but the present disclosure is not limited thereto. In other embodiments, the patterned insulating structure of the stretchable substrate is provided with an active element, and the stretchable substrate is an active display device.

Figure 3A:
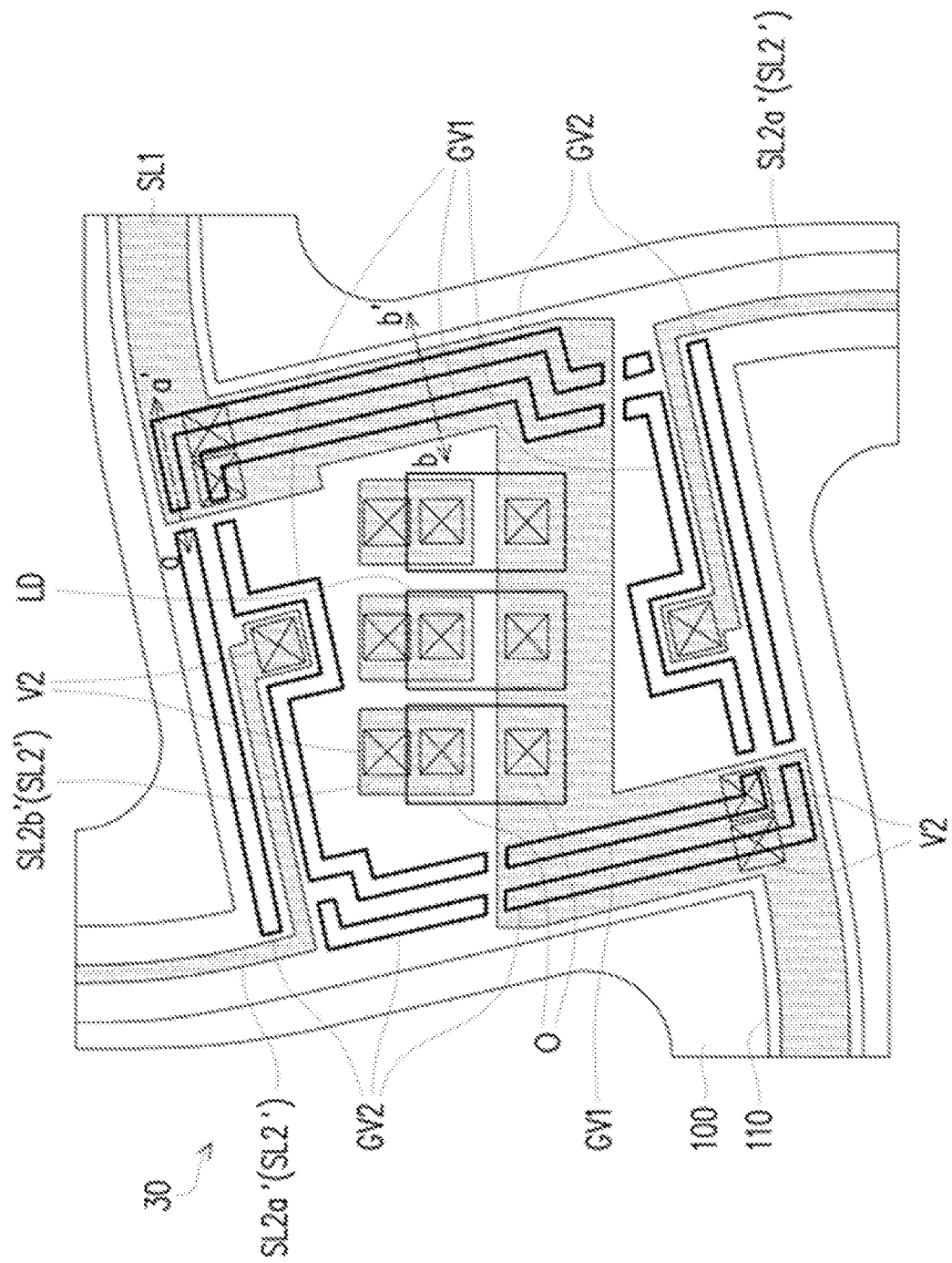
FIG. 3A is a partial top schematic view of a stretchable substrate according to one embodiment of the present disclosure.
Figure 3B:
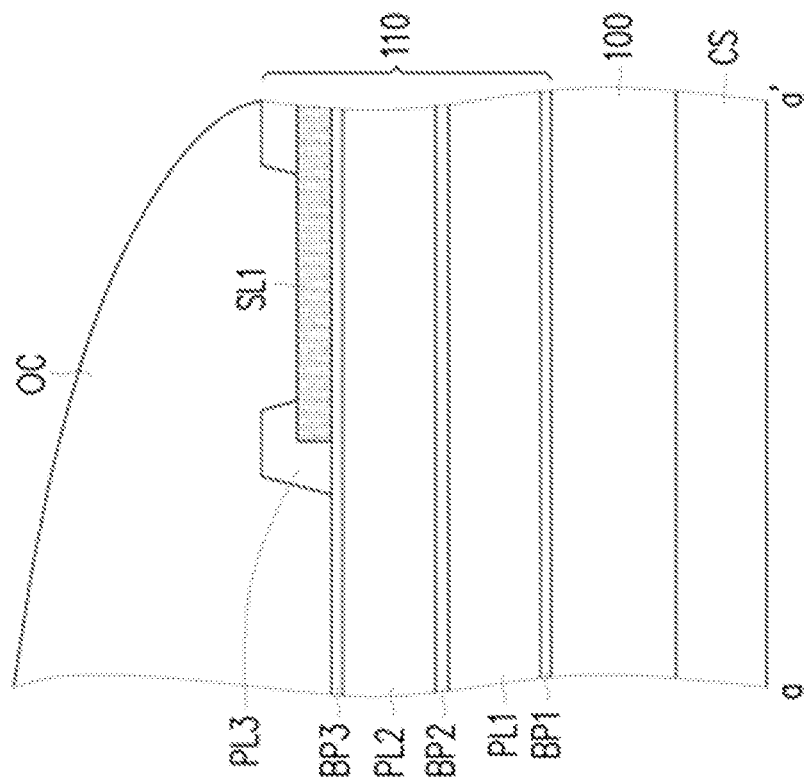
FIG. 3B is a sectional schematic view of a stretchable substrate according to one embodiment of the present disclosure.
Figure 3C:
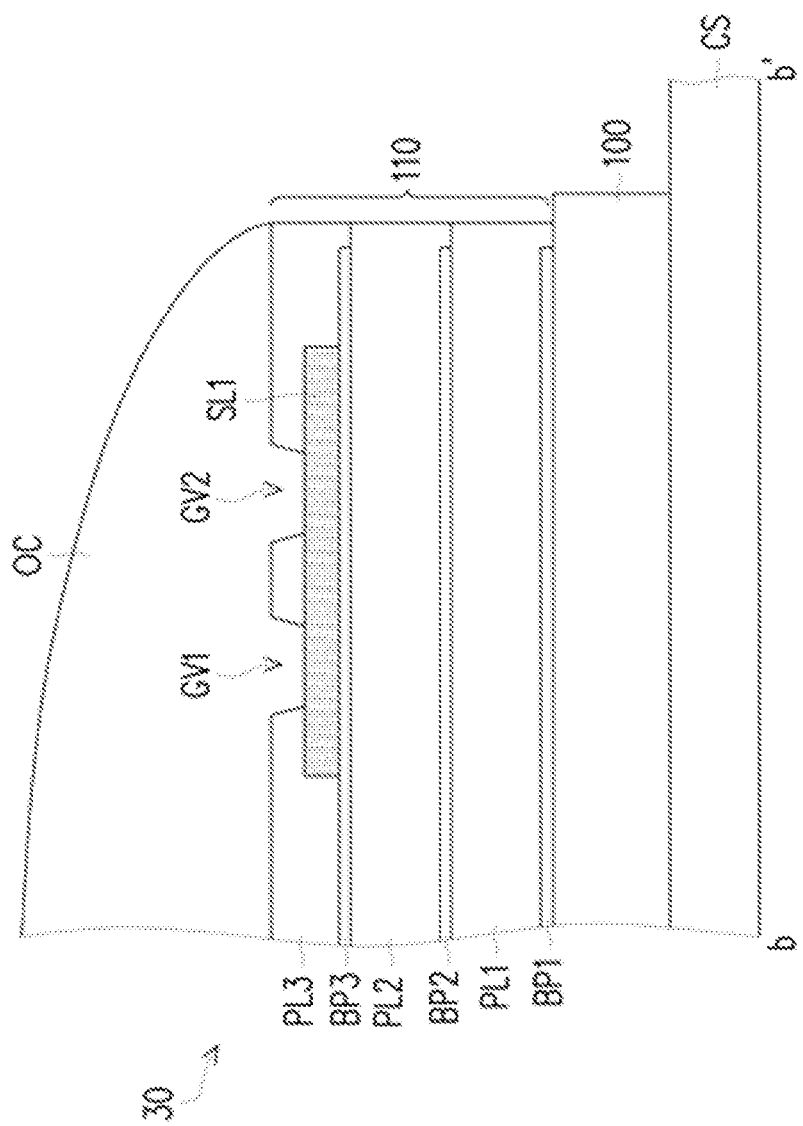
FIG. 3C is a sectional schematic view of a stretchable substrate according to one embodiment of the present disclosure.

FIG. 3A is a partial top schematic view of a stretchable substrate according to one embodiment of the present disclosure. Specifically, FIG. 3A illustrates the third conductive layer M3, the third insulating layer PL3 and the display elements LD, and other components therein are omitted. FIGS. 3B and 3C are sectional schematic views of a stretchable substrate according to one embodiment of the present disclosure, in which FIGS. 3B and 3C respectively correspond to locations of the lines a-a' and b-b' in FIG. 3A. It should be noted that the embodiment of FIGS. 3A to 3C takes the reference numbers and certain contents of the embodiments of FIG. 2, in which the identical or similar reference numbers are used to refer to identical or similar elements, and descriptions of identical technology are hereinafter omitted. The descriptions of the omitted parts may be referenced in the aforementioned embodiments, and are thus not further elaborated herein.

Referring to FIGS. 3A to 3C, the stretchable substrate 30 (also referred to as a stretchable display device) includes a patterned substrate 100, a patterned insulating structure 110, a plurality of display elements LD, a plurality of conductive wires and a plurality of covering layers (not shown in FIG. 3A).

The surface of each device portion of the stretchable substrate 30 has a plurality of openings O, a plurality of first grooves GV1 separated from each other, and a plurality of second grooves GV2 separated from each other. The second grooves GV2 are located farther away from the corresponding display elements LD than the first grooves GV1. The second grooves GV2 partially surround the first grooves GV1, and the first grooves GV1 at least partially surround the openings O.

In the present embodiment, some of the second conductive wires SL2' extend into the device portions. The third insulating layer PL3 between two adjacent second grooves GV2 covers the side surfaces and the top surfaces of the second conductive wires SL2' of the conductive wires. In other words, in the present embodiment, the side surfaces and the top surfaces of the second conductive wires SL2' are not exposed by the second grooves GV2.

In the present embodiment, the second conductive wires SL2' extend from the location between two adjacent second grooves GV2 to the location between the second grooves GV2 and the first grooves GV1, and are laterally located between the second grooves GV2 and the first grooves GV1. In the present embodiment, the second conductive wires SL2' are selectively electrically connected to the display elements LD or other elements in the device portions. For example, the transmitting portions SL2a' of the second conductive wires SL2' are electrically connected to the connecting portions below the openings O through the conductive structures in the second conductive layer (not shown in FIGS. 3A to 3C), and are electrically connected to the display elements LD through the connecting portions.

In the present embodiment, the third insulating layer PL3 covers the side surfaces of the first conductive wires SL1, and some of the first grooves GV1 and some of the second grooves GV2 partially expose the top surfaces of the first conductive wires SL1.

Figure 4A:
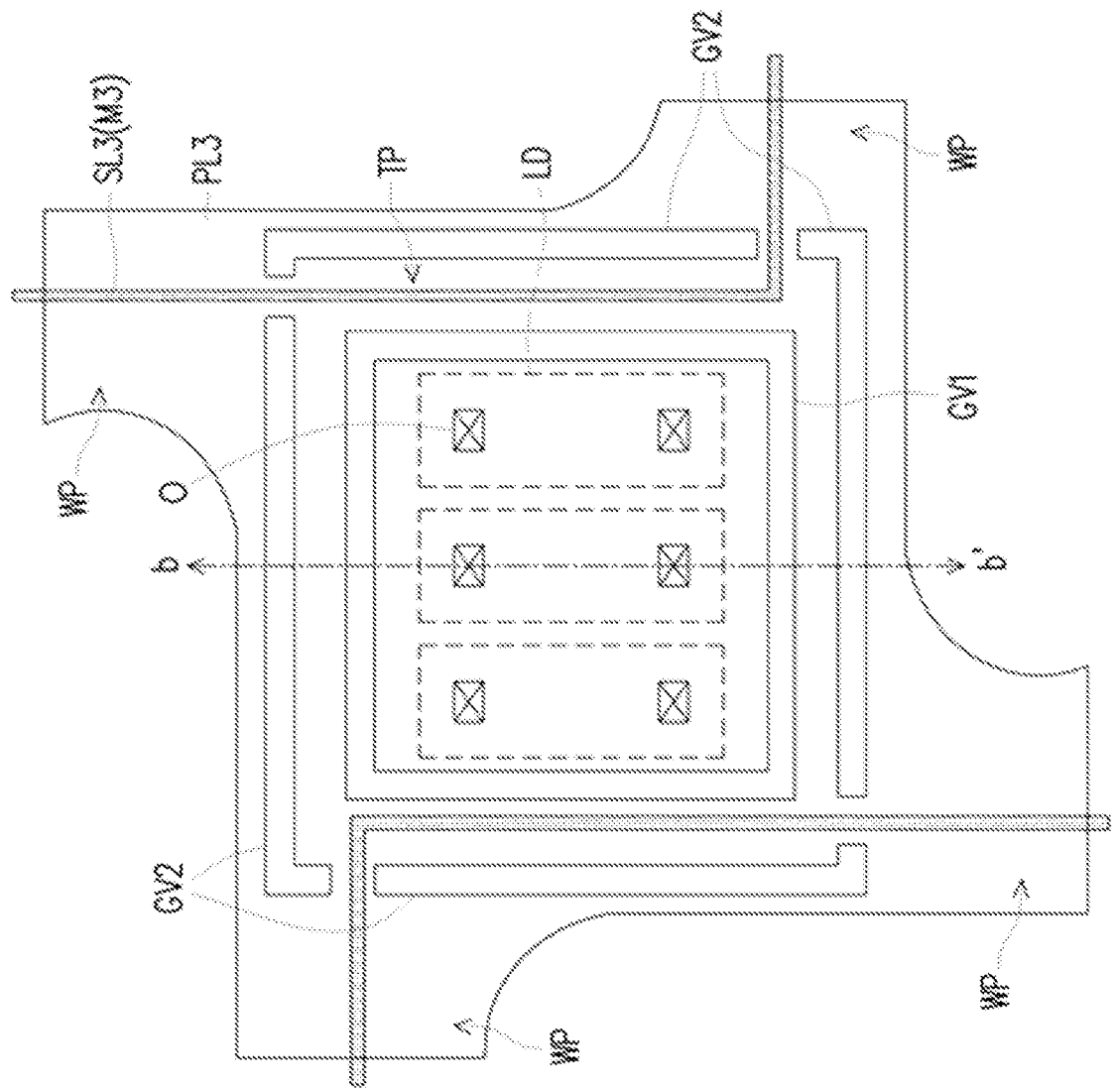
FIG. 4A is a partial top schematic view of a stretchable substrate according to one embodiment of the present disclosure.
Figure 4B:
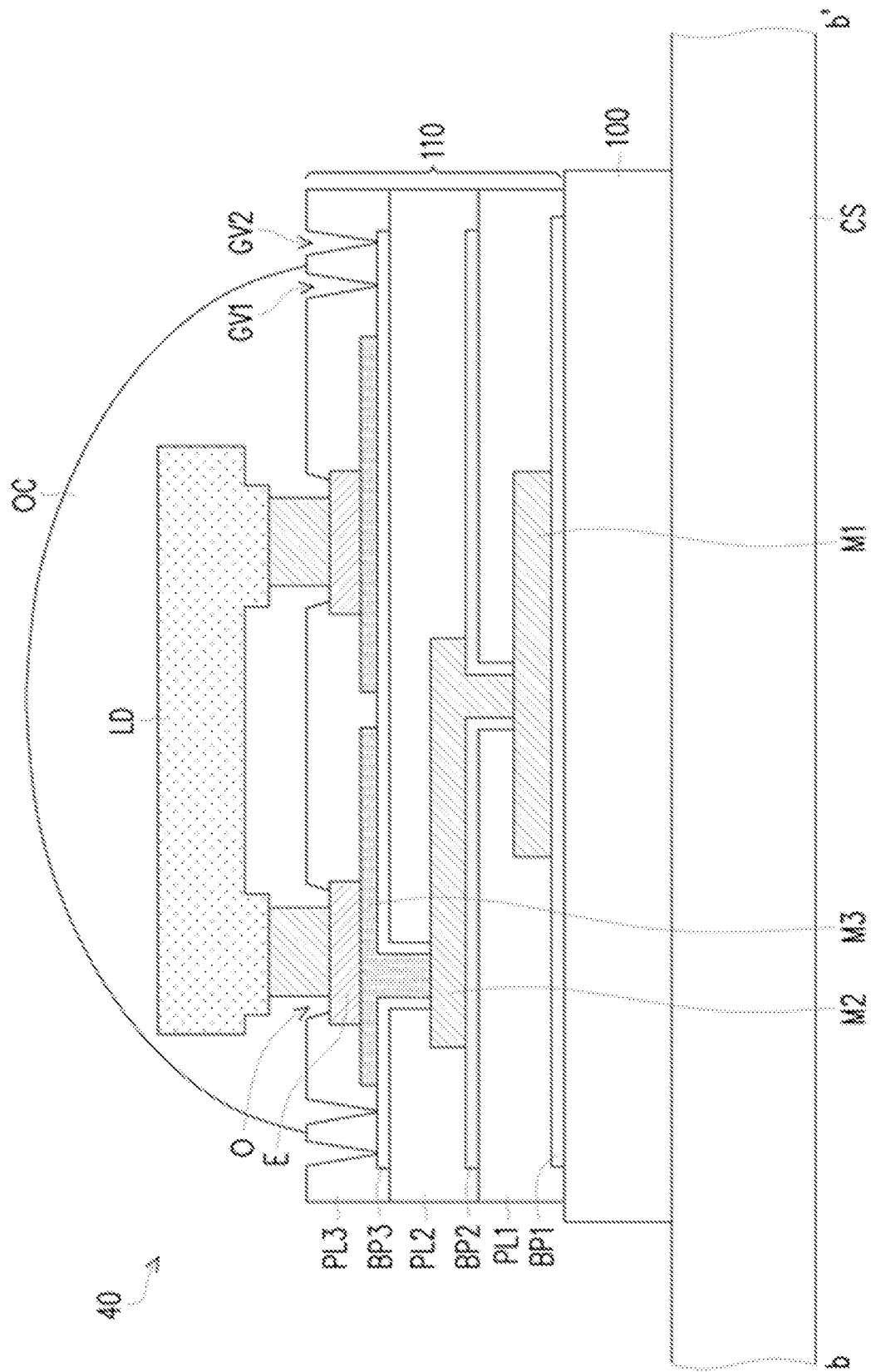
FIG. 4B is a sectional schematic view of a stretchable substrate according to one embodiment of the present disclosure.

FIG. 4A is a partial top schematic view of a stretchable substrate according to one embodiment of the present disclosure. Specifically, FIG. 4A illustrates the conductive wires SL3 of the third conductive layer, the third insulating layer PL3 and the display elements LD, and other components therein are omitted. FIG. 4B is a sectional schematic view of a stretchable substrate according to one embodiment of the present disclosure, where FIG. 4B corresponds to the location of the line a-a' in FIG. 4A. It should be noted that the embodiment of FIGS. 4A and 4B takes the reference numbers and certain contents of the embodiments of FIGS. 3A to 3C, in which the identical or similar reference numbers are used to refer to identical or similar elements, and descriptions of identical technology are hereinafter omitted. The descriptions of the omitted parts may be referenced in the aforementioned embodiments, and are thus not further elaborated herein.

Referring to FIGS. 4A and 4B, in the present embodiment, the stretchable substrate 40 (also referred to as a stretchable display device) includes a patterned substrate 100, a patterned insulating structure 110, a plurality of display elements LD, a plurality of conductive wires and a plurality of covering layers (not shown in FIG. 4A).

The surface of each device portion of the stretchable substrate 40 has a plurality of openings O, a plurality of first grooves GV1 surrounding the openings O, and a plurality of second grooves GV2 separated from each other. The second grooves GV2 are located farther away from the corresponding display elements LD than the first grooves GV1. The second grooves GV2 partially surround the first grooves GV1.

In the present embodiment, the conductive wires SL3 of the third conductive layer M3 extend from one side of the device portions to another side thereof adjacent to the one side thereof. For example, in FIG. 4A, one conductive wire SL3 extends from the left side of the device portion TP to the lower side of the device portion TP, and another conductive wire SL3 extends from the upper side of the device portion TP to the right side of the device portion TP. In other words, in the present embodiment, the conductive wires are not limited to extend from one side of the device portions TP to the opposing side of the one side thereof. That is, it is not limited that the conductive wires extend from the left side of the device portions TP to the right side thereof, or from the upper side thereof to the lower side thereof.

In the present embodiment, to prevent the second grooves GV2 from exposing the side surfaces of the conductive wires SL3, the surface of each device portion TP is provided with a plurality of second grooves GV2 separated from each other. For example, the second grooves GV2 are located in the third insulating layer PL3, and the third insulating layer PL3 covers the top surfaces and the side surfaces of the conductive wires SL3. In the present embodiment, some of the conductive wires SL3 extend into the device portions. The third insulating layer PL3 between two adjacent second grooves GV2 covers the side surfaces and the top surfaces of the conductive wires SL3. In other words, in the present embodiment, the side surfaces and the top surfaces of the conductive wires SL3 are not exposed by the second grooves GV2.

In the present embodiment, the covering layers OC are filled in the first grooves GV1, and are selectively filled in or not filled in the second grooves GV2.

Based on the foregoing disclosure, by providing the first grooves GV and the second grooves GV2, the issue resulted by the overflow of the covering layers may be prevented.

Figure 5:
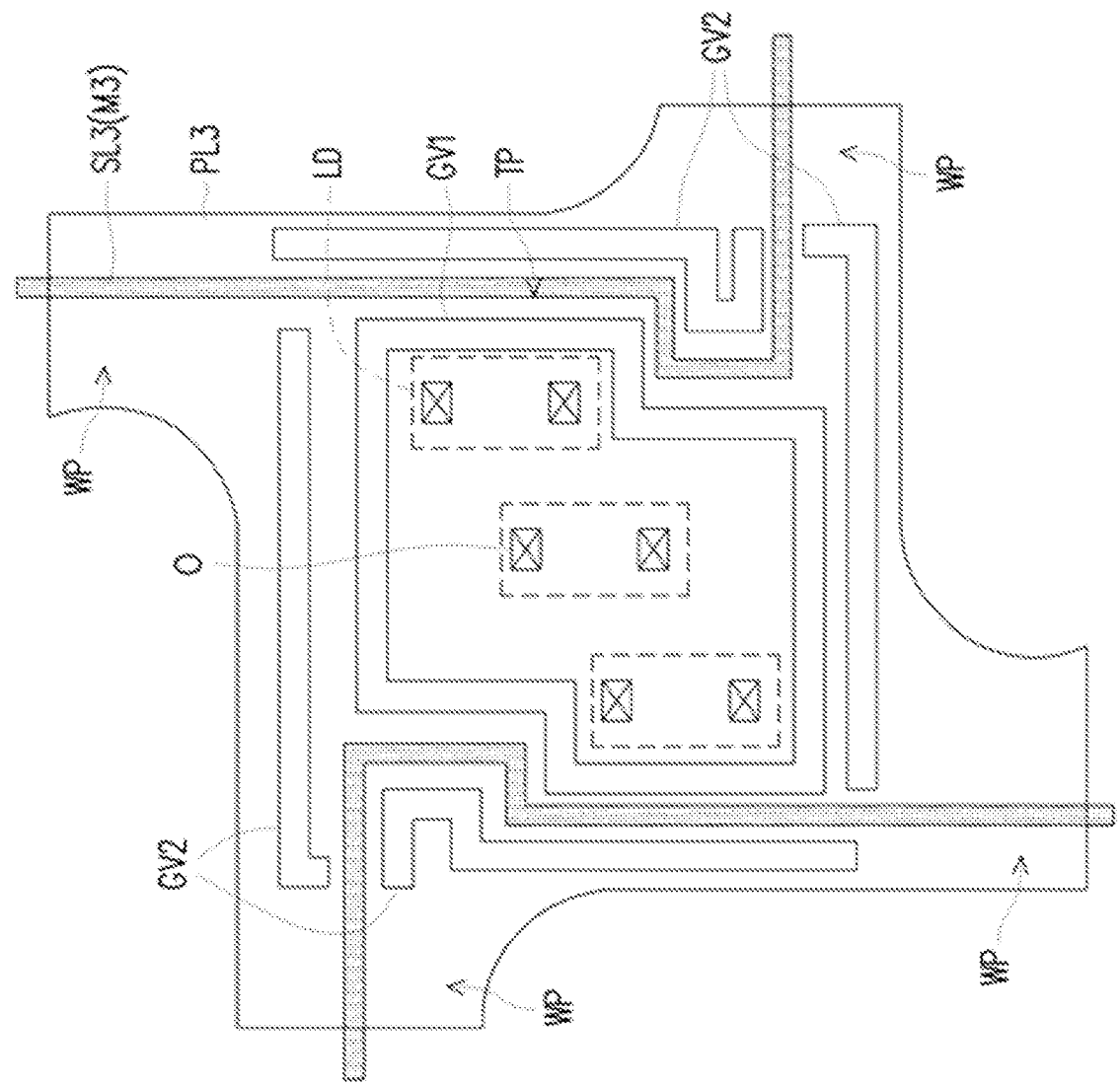
FIG. 5 is a partial top schematic view of a stretchable substrate according to one embodiment of the present disclosure.

FIG. 5 is a partial top schematic view of a stretchable substrate according to one embodiment of the present disclosure. Specifically, FIG. 5 illustrates the conductive wires SL3 of the third conductive layer and the third insulating layer PL3, and other components therein are omitted. It should be noted that the embodiment of FIG. 5 takes the reference numbers and certain contents of the embodiments of FIGS. 4A and 4B, in which the identical or similar reference numbers are used to refer to identical or similar elements, and descriptions of identical technology are hereinafter omitted. The descriptions of the omitted parts may be referenced in the aforementioned embodiments, and are thus not further elaborated herein.

Referring to FIG. 5, in the present embodiment, the conductive wires SL3 of the stretchable substrate 20 (also referred to as a stretchable display device) have a plurality of turns in the device portions TP. In the present embodiment, the first grooves GV1 and the second grooves GV2 not only have turns at the four corners corresponding to the device portions, but the first grooves GV1 and the second grooves GV2 also have turns corresponding to the conductive wires SL3, thus increasing the lengths of the first grooves GV1 and the lengths of the second grooves GV2.

In the present embodiment, by increasing the lengths of the first grooves GV1 and the lengths of the second grooves GV2, the area of the first grooves GV1 and the second grooves GV2 in contact with the covering layers (not shown in FIG. 5) may be further increased, thus being conducive to limiting the covering layers on the device portions TP, and preventing the covering layers from overflowing outside the device portions TP.

Figure 6:
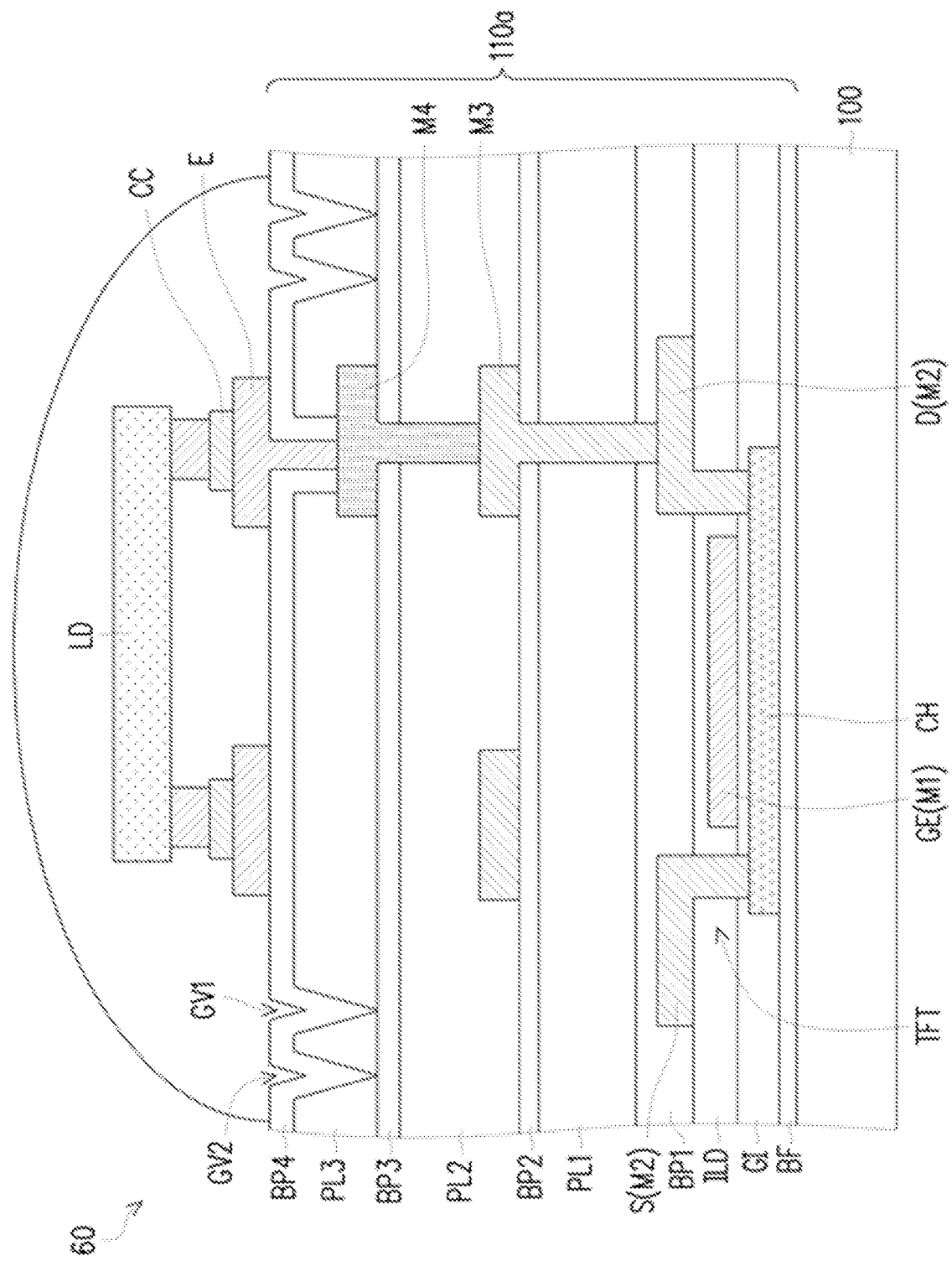
FIG. 6 is a sectional schematic view of a stretchable substrate according to one embodiment of the present disclosure.

FIG. 6 is a sectional schematic view of a stretchable substrate according to one embodiment of the present disclosure. It should be noted that the embodiment of FIG. 6 takes the reference numbers and certain contents of the embodiments of FIGS. 1A and 1B, in which the identical or similar reference numbers are used to refer to identical or similar elements, and descriptions of identical technology are hereinafter omitted. The descriptions of the omitted parts may be referenced in the aforementioned embodiments, and are thus not further elaborated herein.

Referring to FIG. 6, in the present embodiment, the stretchable substrate 60 (also referred to as a stretchable display device) further includes an active element TFT. The active element TFT is located in the patterned insulating structure 110a, and is electrically connected to the display elements LD.

In the present embodiment, the patterned insulating structure 110a include a barrier layer BF, a gate insulating layer GI, an interlayer dielectric layer ILD, a first insulating layer PL1, a second insulating layer PL2 and a third insulating layer PL3. In the present embodiment, the patterned insulating structure 110a selectively include a first buffer layer BP1, a second buffer layer BP2, a third buffer layer BP3 and a fourth buffer layer BP4.

In certain embodiments, the barrier layer BF, the gate insulating layer GI, the interlayer dielectric layer ILD, the first buffer layer BP1, the first insulating layer PL1, the second buffer layer BP2, the second insulating layer PL2, the third buffer layer BP3, the third insulating layer PL3 and the fourth buffer layer BP4 include organic or inorganic insulating materials.

The barrier layer BF is located on the patterned substrate 100. A semiconductor channel layer CH is located on the barrier layer BF. The gate insulating layer GI is located on the semiconductor channel layer CH. A gate electrode GE of the first conductive layer M1 is located on the gate insulating layer GI, and overlaps with the semiconductor channel layer CH. The interlayer dielectric layer ILD is located on the first conductive layer M1 and the gate insulating layer GI. A drain electrode D and a source electrode S of the second conductive layer M2 are located on the interlayer dielectric layer ILD, and are electrically connected to the semiconductor channel layer CH. In the present embodiment, the active element TFT includes the gate electrode GE, the semiconductor channel layer CH, the drain electrode D and the source electrode S. In the present embodiment, the active element TFT is a top gate electrode type thin-film transistor, but the present disclosure is not limited thereto. In other embodiments, the active element TFT may be a bottom gate electrode type thin-film transistor or other types of thin film transistors.

The first buffer layer BP1, the first insulating layer PL1 and the second buffer layer BP2 are located on the second conductive layer M2 and the interlayer dielectric layer ILD. The third conductive layer M3 is located on the second buffer layer BP2, and the third conductive layer M3 is at least partially electrically connected to the active element TFT. The second insulating layer PL2 and the third buffer layer BP3 are located on the third conductive layer M3 and the second buffer layer BP2. The fourth conductive layer M4 is located on the third buffer layer BP3, and the fourth conductive layer M4 is at least partially electrically connected to the third conductive layer M3. The third insulating layer PL3 and the fourth buffer layer BP4 are located on the fourth conductive layer M4. The electrodes E are located on the fourth buffer layer BP4, and the electrodes E are at least partially electrically connected to the active element TFT through the third conductive layer M3 and the fourth conductive layer M4. The display elements LD are electrically connected to the electrodes E through the conductive connecting structures CC. In certain embodiments, the conductive connecting structures CC include, for example, In, Sn, Bi, conductive adhesives, a combination thereof, or other suitable materials.

The surface of the device portions TP are provided with the first grooves GV1 and the second grooves GV2. In the present embodiment, the first grooves GV1 and the second grooves GV2 are located in the third insulating layer PL3, the fourth buffer layer BP4 covers the surfaces of the first grooves GV1 and the second grooves GV2, and the fourth buffer layer BP4 does not completely fill the first grooves GV1 and the second grooves GV2. The first grooves GV1 at least partially surround the display elements LD, and the second grooves GV2 at least partially surround the first grooves GV1. In the present embodiment, the first grooves GV1 and the second grooves GV2 do not expose the top surface and the side surface of the fourth conductive layer M4, thus preventing the top surface and the side surface of the fourth conductive layer M4 from being etched by the etchant used in forming the electrodes E. In certain embodiments, the first grooves GV1 and the second grooves GV2 partially expose the top surface of the fourth conductive layer M4, but the first grooves GV1 and the second grooves GV2 do not partially expose the side surface of the fourth conductive layer M4.

In sum, by providing grooves on the surfaces of the device portions of the pattern insulating structure, the overflow of the covering layers may be prevented, thus enhancing the production yield of the stretchable substrate.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A stretchable substrate, comprising:
   a patterned insulating structure, comprising a plurality of device portions, a plurality of circuit portions and a plurality of recesses,
      wherein a surface of each of the device portions has at least one first groove, at least two of the device portions are separated by one of the recesses, and four of the first grooves of the device portions surround one of the recesses; and
      wherein a width of each of the circuit portions is less than a width of each of the device portions, and adjacent ones of the device portions are connected via corresponding ones of the circuit portions;
   a plurality of conductive wires, located in the circuit portions;
   a plurality of display elements, correspondingly located on the device portions, wherein the at least one first groove of each of the device portions surrounds a corresponding one of the display elements; and
   a plurality of covering layers, wherein each of the covering layers is located on a corresponding one of the device portions and covers the corresponding one of the display elements, wherein each of the covering layers is correspondingly filled into and covers the at least one first groove of the corresponding one of the device portions and does not contact at least one of the recesses adjacent to the at least one first groove of the corresponding one of the device portions.

2. The stretchable substrate according to claim 1, wherein the surface of each of the device portions has a plurality of second grooves separated from each other, the second grooves are located farther from the corresponding one of the display elements than the at least one first groove, and the second grooves partially surround the at least one first groove.

3. The stretchable substrate according to claim 2, wherein at least one of the conductive wires extends from the circuit portions into the device portions, and is located laterally between the second grooves and the at least one first groove.

4. The stretchable substrate according to claim 1, wherein the patterned insulating structure comprises:
   a first insulating layer, located above a patterned substrate;
   a second insulating layer, located above the first insulating layer; and
   a third insulating layer, located above the second insulating layer, wherein the at least one groove is located in the third insulating layer, wherein the third insulating layer covers a side surface of at least one of the conductive wires, and the at least one first groove partially exposes a top surface of the at least one of the conductive wires.

5. The stretchable substrate according to claim 1, wherein the patterned insulating structure comprises:
   a first insulating layer, located above a patterned substrate;
   a second insulating layer, located above the first insulating layer; and
   a third insulating layer, located above the second insulating layer, wherein the at least one groove and a plurality of second grooves separated from each other are located in the third insulating layer, wherein the second grooves surround the at least one first groove, and the third insulating layer between two adjacent ones of the second grooves covers a side surface and a top surface of at least one of the conductive wires.

6. The stretchable substrate according to claim 1, wherein each of the device portions is provided with at least three corresponding ones of the display elements, the device portions are arranged in an array along a first direction and a second direction, and the conductive wires comprise:
   a plurality of first conductive wires, extending along the first direction, and electrically connected to the display elements on the device portions arranged in the first direction; and
   a plurality of second conductive wires, extending along the second direction, and electrically connected to the display elements on the device portions arranged in the second direction, wherein the at least three corresponding ones of the display elements on each of the device portions are electrically connected to at least three corresponding ones of the second conductive wires respectively, and the at least three corresponding ones of the display elements on each of the device portions are electrically connected to a same corresponding one of the first conductive wires.

7. A stretchable display device, comprising:
a patterned insulating structure, comprising a plurality of device portions, a plurality of circuit portions and a plurality of recesses,
   wherein the device portions are arranged in an array along a first direction and a second direction; and
   wherein a width of each of the circuit portions is less than a width of each of the device portions, and adjacent ones of the device portions are connected through corresponding ones of the circuit portions;
a plurality of display elements, correspondingly located on the device portions, wherein a surface of each of the device portions has at least one first groove surrounding a corresponding one of the display elements, and four of the first grooves of the device portions surround one of the recesses;
a plurality of conductive wires, electrically connected to the display elements; and
a plurality of covering layers, wherein each of the covering layers is located on a corresponding one of the device portions and covers the corresponding one of the display elements, wherein each of the covering layers is correspondingly filled into and covers the at least one first groove of the corresponding one of the device portions and does not contact at least one of the recesses adjacent to the at least one first groove of the corresponding one of the device portions.

* * * * *